United States Patent [19]
Anderson

[11] Patent Number: 6,147,851
[45] Date of Patent: Nov. 14, 2000

[54] METHOD FOR GUARDING ELECTRICAL REGIONS HAVING POTENTIAL GRADIENTS

[76] Inventor: Karl F. Anderson, 3761 West Ave., No. J-14, Lancaster, Calif. 93563-6304

[21] Appl. No.: 09/245,555

[22] Filed: Feb. 5, 1999

[51] Int. Cl.$^7$ ...................................................... H02H 7/00
[52] U.S. Cl. ............................ 361/107; 361/108; 333/12
[58] Field of Search ..................... 361/107, 108, 361/110, 56, 111; 307/105; 333/12, 202, 206; 174/35 R, 36

[56] References Cited

U.S. PATENT DOCUMENTS

| | | |
|---|---|---|
| 2,282,319 | 5/1942 | Brown . |
| 3,193,712 | 7/1965 | Harris . |
| 3,484,679 | 12/1969 | Hodgson et al. . |
| 3,705,365 | 12/1972 | Szabo et al. ............................... 333/12 |
| 3,760,298 | 9/1973 | Pell ............................................ 333/12 |
| 5,095,891 | 3/1992 | Reitter ....................................... 601/4 |

*Primary Examiner*—Josie Ballato
*Assistant Examiner*—Kim Huynh
*Attorney, Agent, or Firm*—Morland C. Fischer

[57] ABSTRACT

A multi-potential guarding technique for preventing electrical charge exchange to or from an electrical system containing potential gradients and sources of electrical noise. An inner electrically conductive guard shield surrounds the system to be guarded. The electrical potential of the inner electrically conductive guard shield is such that there is ideally no net current flow to the guard shield from the electrical system therewithin. An outer electrically conductive guard shield surrounds the inner electrically conductive guard shield. An operational amplifier drives the outer electrically conductive guard shield to an electrical potential that is substantially equal to that of the inner electrically conductive guard shield so that there is substantially no potential difference between the inner and outer guard shields which has the effect of producing a high insulation impedance around the guarded system. The multi-potential guarding technique of this invention has application in a gradient-guard configuration and a charge-channel configuration.

12 Claims, 5 Drawing Sheets

METHOD FOR GUARDING ELECTRICAL REGIONS HAVING POTENTIAL GRADIENTS

BACKGROUND OF THE INVENTION

1. Field of the Invention

This invention relates to a method for preventing electrical charge exchange within an electrical system containing potential gradients (i.e. the voltage is not constant). Accordingly, leakage and noise currents are prevented from escaping or entering a conductor when the insulation thereof might be inadequate (e.g. particularly in wet environments or at high temperatures). A principal application of the present invention is to prevent leakage from or into a conductor that supplies current to or voltage from a remote sensor (e.g. a resistance temperature detector) where the calibration of the sensor depends upon current through or voltage across the sensor.

2. Background Art

Guarding is a well known technique for reducing the effects of electrical current leakage through electrical conductors as a consequence of imperfect insulation and shunt capacitance in low level and highly precise measurements and reducing common mode interference. These effects result from the finite impedance to ground and to nearby conductors that accumulate throughout a system.

Guarding has been traditionally applied to protect regions containing a single electrical potential. Driven guards typically take the form of an electrostatic enclosure and are often referred to as shields or guard shields. Any electrical circuit will necessarily develop voltage gradients when it is placed in operation. A non-self-generating voltage gradient example is a current carrying conductor that develops a potential gradient along its length. Some self-generating voltage gradient examples include parasitic potentials that develop within a guarded region via tribo and radiation-electric effects as well as the changing potential on mechanically variable cable capacitance holding an essentially constant charge. By way of further example, when using platinum resistance temperature detectors to obtain accurate measurements in high temperature environments, it was found that some temperatures were so high that available insulation compounds developed unacceptable levels of leakage. Such leakage adversely effected the accuracy of measurement and increased uncertainties relating thereto.

Accordingly, what is needed is a more effective and reliable guarding technique whereby almost any circuit or conductor can experience essentially no leakage in operation, even where poor insulation exists between the circuit and its environment and where parasitic electrical charges exist between a conductor and its environment. Reference may be made to the following U.S. patents which describe methods for guarding electrical regions:

| | |
|---|---|
| 3,866,093 | Kusters et al. |
| 4,115,790 | Tsunefuji |
| 5,434,512 | Schwindt et al. |
| 5,457,398 | Schwindt et al. |

SUMMARY OF THE INVENTION

While conventional guarding techniques prevent regions containing a single electrical potential from exchanging electrical charge with the remaining environment as a consequence of imperfect insulation, the presently disclosed invention relates to an improved multi-potential guarding technique that prevents electrical charge exchange from regions containing potential gradients (i.e. the voltage is not constant). The multi-potential guarding technique described herein is adapted to suppress noise originating within a cable that connects a transducer to signal conditioning electronics as well as noise originating between an active circuit and its associated guarding conductors. Gradient guard and charge channel versions of the improved guarding technique are described.

Experimental results demonstrate that a current carrying conductor, having a significant IR drop and protected within a charge channel, can have the same entry and exit current despite poor and varying insulation performance from the conductor to the environment. Additional experimental results demonstrate that the improved guarding technique of this invention prevents potentials generated between a conductor and its guard from influencing external signals. Moreover, it will be shown that the improved guarding technique can significantly reduce the external effects of noise potentials within the guarded region which may arise from tribo-electric effects, radiation exposure, electromechanical inputs, and other noise sources.

In general terms, a method is disclosed for guarding an electrical system that is located within an inner electrically conductive guard that has an electrical potential. Ideally, the electrical potential of the inner guard is such that there is no net current flow to the inner guard from the system located therewithin. The system protected by the inner electrically conductive guard typically contains potential gradient and noise sources. The inner electrically conductive guard is surrounded by an outer electrically conductive guard. The outer guard is driven by means of an operational amplifier to an electrical potential that is substantially identical to the electrical potential of the inner electrically conductive guard, such that there is substantially no potential difference between the inner and outer guards. A first electrical impedance exists between the inner and outer electrically conductive guards, and a second electrical impedance exists between the outer electrically conductive guard and the environment (i.e. electrical ground).

DETAILED DESCRIPTION

Figure 1:
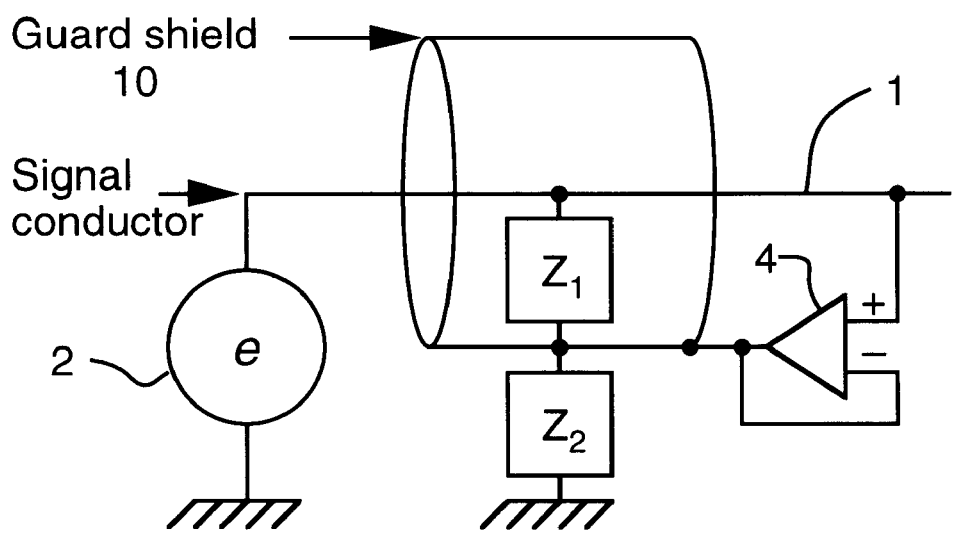
FIG. 1 shows a schematic circuit illustrating the conventional guarding technique for reducing the effects of electrical current leakage from a protected region containing a single electrical potential.

The conventional or single potential guarding technique cancels leakage effects by requiring conductors to be at the same potential. Under these conditions there will be no current between the conductors regardless of the impedance between them. FIG. 1 of the drawings illustrates the known single-potential driven guard shield 10 applied to a conductor 1 which senses a signal from a high-impedance source 2.

In FIG. 1, an operational amplifier 4 is connected as a unity-gain buffer which causes the guard shield 10 to assume the same potential, e, as the signal conductor 1. Because there is no potential difference between the signal conductor 1 and the guard shield 10, no current will flow through insulation impedance $Z_1$ regardless of the potential of source 2. Current that could have leaked from the conductor 1 to ground is supplied instead by the output of the operational amplifier 4 through $Z_2$, thereby preserving all of the signal available from source 2. This approach is widely known as the driven-guard technique to compensate for electrical current leakage through the insulation impedance $Z_1$ of the conductor 1.

Figure 2:
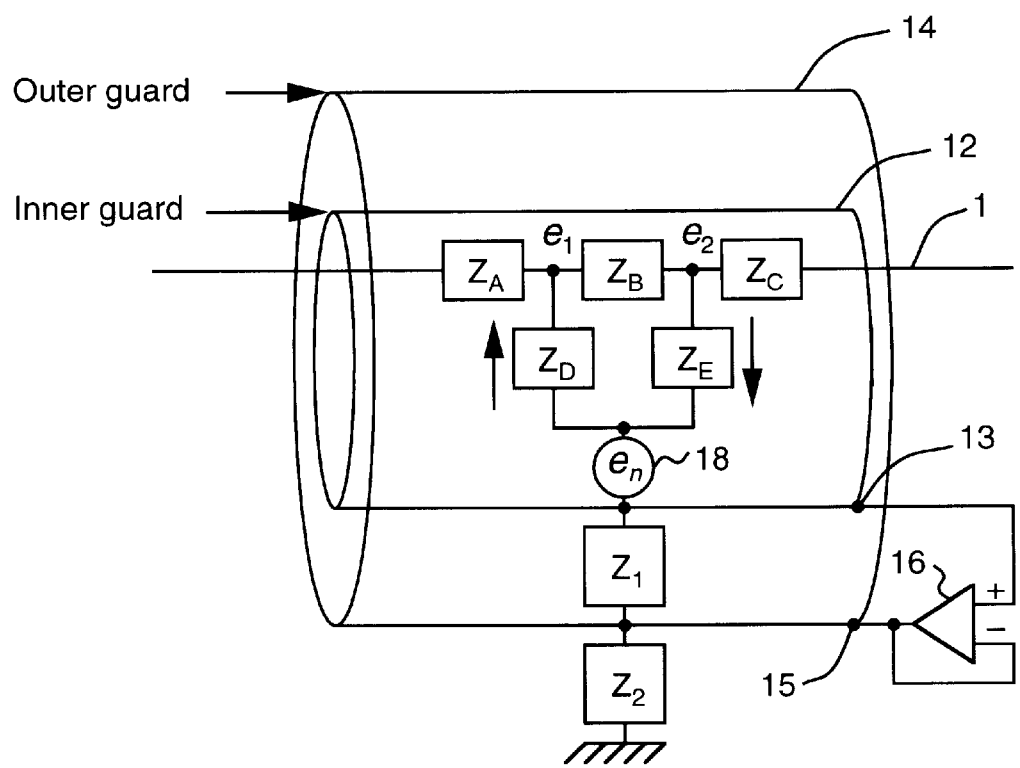
FIG. 2 shows a schematic circuit to illustrate a multi-potential guarding technique according to the present invention to cancel leakage and certain internal voltage effects by means of inner and outer guard shields.

According to one aspect of the present invention, a multi-potential guarding technique cancels leakage and certain internal voltage effects by means of inner and outer guard shields 12 and 14 as illustrated in FIG. 2 of the drawings. Desired electrical potentials $e_1$ and $e_2$ as well as noise potential, $e_n$, exist within the inner guard shield 12. Without an effective guard, these potentials would cause current to flow to ground through any distributed impedance, especially leakage through imperfect insulation. For purpose of illustration, the general case of circuit impedances and leakage paths are represented in lumped form in FIG. 2 by various impedances $Z_A$ through $Z_E$ within the inner guard shield 12. Impedance $Z_1$ exists between the inner and outer guard shields 12 and 14 and impedance $Z_2$ exists from the outer guard shield 14 to the environment.

In one case, the inner guard shield 12 is caused to assume a "balance" potential such that all leakage currents flowing from the more positive potentials within the circuitry to the inner guard shield 12 are matched by other currents from the inner guard shield 12 back to the more negative potentials in the circuitry. In other words, the potential of the inner guard shield 12 is such that the net current flow to the inner guard shield 12 from the circuitry within shield 12 is substantially zero. The balance potential will be somewhere between the extremes of potential within guard shield 12. The outer guard shield 14 is then arranged to assume substantially the same potential as that of the inner guard shield 12.

This situation is similar to the concept of the conventional driven guard illustrated in FIG. 1. However, the signal conductor 1 of FIG. 1 now becomes the shell that contains the volume enclosed by the inner guard shield 12 of FIG. 2. Conventional guard theory applies to the circuit node 13 consisting of the single-potential shell of this inner guard shield 12. Because there is substantially no potential difference between the inner and outer guard shields 12 and 14, substantially no current will flow through impedance $Z_1$, thereby preserving whatever signal potential exists on the inner guard shield 12.

If the above conditions are met, under ideal conditions, there will be no net current flow from the potentials within the inner guard shield 12 to the inner guard shield 12 and no current between the inner and outer guards regardless of the potentials within the inner guard shield 12. Under these same ideal conditions, no current will flow from the potentials within the inner guard shield 12 to the outer guard shield 14 or in other conductors or to ground regardless of the finite insulation impedances distributed within the inner guard, as well as impedance $Z_1$ and $Z_2$.

In practice when the outer guard shield 14 is driven to a potential which is substantially equal to that of the inner guard shield 12, essentially no current can flow between the two guards. The inner guard shield 12 can be analyzed as a circuit node 13 into which the sum of the currents must be zero. So, if no current can leave the inner guard shield through impedance $Z_1$, then the inner guard circuit node 13 must assume a potential such that the currents entering this node from the various potentials within the inner guard shield 12 sum to zero. In this regard, it may be appreciated that driving the outer guard shield 12 from the potential of the inner guard shield 14 causes the inner guard to automatically assume the balance potential.

The inner and outer guard shield arrangement illustrated in FIG. 2 to guard a region containing a potential gradient is similar to the box-within-a-box construction commonly used in sensitive instruments. However, in accordance with this invention, a unity gain operational buffer amplifier 16 having essentially infinite input impedance (e.g. $10^6$ ohms) drives an outer electrically conductive (e.g. copper or aluminum) sheet metal box (i.e. outer guard shield 14) with the potential assumed by an inner box (i.e. inner guard shield 12). Operational amplifier 16 is located outside the outer guard shield 14. The inner electrically conductive sheet metal box is surrounded by and spaced from the outer box. The inner guard node 13 is connected through a small hole in the outer guard shield 14 to the positive non-inverting input to operational amplifier 16, while the negative inverting input of operational amplifier 16 is connected in a feedback loop with the output thereof and outer guard node 15. Extremely good insulation is ordinarily used between the inner and outer conductive boxes of the instrument. But, with the multi-potential guard technique of FIG. 2, even poor insulation between the inner and outer shields 12 and 14 will appear to have essentially infinite impedance. Thus, currents that would typically flow from the region within the inner guard shield 12 to the environment are now automatically provided by the output of operational amplifier 16.

Two general classes of applications for the multi-potential guard technique described above are gradient guards and charge channels. Gradient guards prevent current from flowing between the environment and the guarded circuitry. Charge channels cause the current injected into a guarded region to be channeled such that all of the injected current exits in the region at only the desired point or points.

The gradient guard application of the multi-potential guard technique is illustrated in FIG. 2. As long as a noise source 18 does not alter the other potential gradients within the inner guard shield 12, the effects of noise will be eliminated and no charge will be exchanged between the inner guard region and its external environment. This feature can reduce noise experienced within a signal carrying conductor 1 when various noise-generating effects cause the insulation to accumulate a charge.

The gradient guard application of FIG. 2 applies to the two dimensional surface-guard case as well as to the three dimensional volume-guard case. Therefore, the surface of a printed circuit board or integrated circuit can benefit from a gradient guard as well as circuitry contained within a guarded volume.

In accordance with a two dimensional surface construction, a printed circuit is laid out on the usual non-conductive printed circuit board. The printed circuit is surrounded by an inner electrically conductive trace (i.e. inner guard shield 12), and the inner electrically conductive trace is surrounded by and spaced from an outer electrically conductive trace (i.e. outer guard shield 14). The double guard shields formed by the inner and outer traces are driven by an operational amplifier that is connected in the same manner as the amplifier 16 of FIG. 2.

In accordance a three dimensional volume construction, a wire that carries information is surrounded along its entire length by an inner electrically conductive braided or foil covering (i.e. the inner guard shield 12), and the inner covering is surrounded by and spaced from an outer electrically conductive braided or foil covering (i.e. the outer guard shield 14). The double shielded cable formed by the inner and outer covering is driven by an operation amplifier that is connected in the same manner as the amplifier 16 of FIG. 2.

A gradient guard can be applied to equipment located in poorly-insulated and charge-developing environments. Examples are areas with high humidity and/or temperature and contamination or ionization as well as areas or volumes that include parasitic energy sources. There can even be a conductive liquid between the inner and outer guards and between the outer guard and the environment. The operational amplifier 16 driving the outer guard shield 14 supplies the necessary current to the environment around the outer guard as long as the conductivity of the liquid is significantly less than the conductivity of the guard shields 12 and 14.

Figure 3:
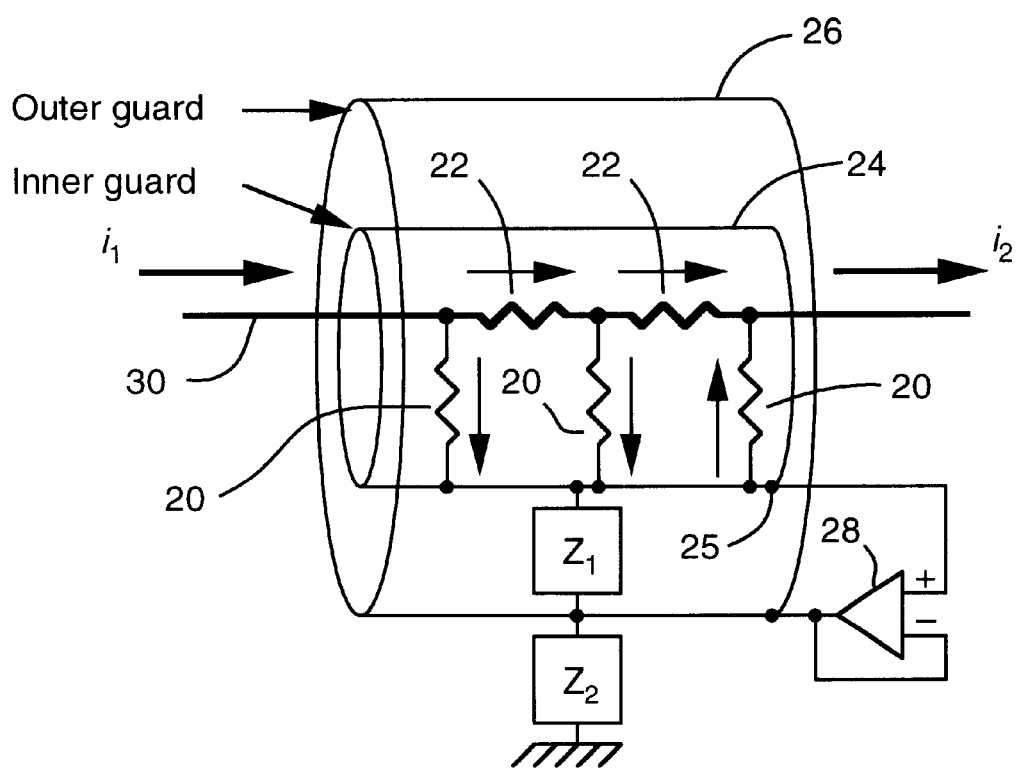
FIG. 3 shows a schematic circuit to illustrate a charge-channel application of the multi-potential guard technique illustrated in FIG. 2.

The charge-channel application of the multi-potential guard technique is illustrated in FIG. 3. This application also applies to the two-dimensional surface-guard case as well as to the three-dimensional volume-guard case. Distributed wire and insulation resistances 20 and 22 are represented in lumped-parameter form. The double guard inner and outer shields 24 and 26 are driven by an operational amplifier 28 connected in the same manner as the amplifier 16 of FIG. 2. Noise voltages (not shown) can also exist within the inner guard shield 24. Ideally, when no current can flow through impedance $Z_1$ then, as previously disclosed when referring to FIG. 2, the inner-guard circuit node 25 must assume the potential that results in no net current flow from the current-carrying conductor 30. Therefore, input current $i_1$ must equal exit current $i_2$. A perfectly insulated conducting region leaks no charge to its surrounding environment and will deliver all mobile charges that are injected at one point (and not stored on the conductor) to one or more other points where they will exit from the conductor 30. A real conductor in a charge channel appears to be embedded in essentially perfect insulation, even if noise sources exist within the inner guard.

One particular application for the charge channel technique of FIG. 3 is excitation wiring through hostile environments to platinum resistance thermometers (PRTs). The charge channel technique can prevent insulation leakage from allowing current to shunt around the sensing element (e.g. such as the electrical load impedance designated 42 in FIG. 4) and thereby cause its apparent resistance (and indicated temperature) to be lower than its actual resistance. In fact, it is necessary to employ a charge-channel guard around only one conductor carrying current in an Anderson loop signal conditioner.

Four significant limitations of the multi-potential guarding technique have been identified. First, while this technique will theoretically eliminate charge transfer from the inner guard to the environment, it cannot guarantee that potential gradients within the inner guard are unaffected by all internal impedance variations or noise sources.

Second, for best performance, each conductor in a signal pair or an excitation pair may require its own multi-potential guard. To the extent that two conductors are at essentially the same potential and they are balanced within the inner guard shield with respect to leakage and noise voltages, they may be simultaneously protected within the same multi-potential guard. This should be regarded as a special case which may not apply in a given application. The conventional single potential guard of FIG. 1 also shares this limitation.

Third, the multi-potential guard disclosed herein is a guard and not a shield in the sense that a coax cable carrying video signals has a shield within which electromagnetic fields propagate and by which outside signals are attenuated. An additional shield, grounded at each end, is required around the multi-potential guard to provide this shield function. The conventional single potential guard of FIG. 1 also shares this limitation.

Fourth, the practical capabilities of the guard-drive operational amplifier can limit effectiveness of the multi-potential guarding technique. Real amplifiers lack infinite gain and bandwidth and have input offset voltages and currents which influence overall guard quality. The conventional single potential guard of FIG. 1 also shares this limitation.

Theoretically, there is no limit to the dimensions of a guarded region or to the number of guard groups in a system. A multi-potential guard can enclose a surface area or a volume and apply to a portion of an integrated circuit, a current carrying or potential sensing conductor, a test probe assembly in a wafer test system, an electronic instrument, even to a building or a signal transmission cable.

The most significant consideration to be observed in applying the multi-potential guarding technique is the need for the inner guard shield to act in effect as a single equipotential node. Therefore, wavelength and propagation delay effects must be considered when high frequencies are involved. Also, the guard shields should be a few orders of magnitude more conductive than the finite impedance of the insulation in the system.

Another practical consideration is the need for the inner guard shield to receive no net charge from the region between the inner and outer guard shields. But, any outer guard can itself be treated as an inner guard shield by the application of an additional driven guard shield to prevent inter-guard charge transfer in unusual situations.

Practical operational amplifiers require a path for input bias currents to flow. A sufficient bias current path may exist through poor insulation for operational amplifiers serving in multi-potential guard applications. But care should be taken to assure that an appropriate bias current path exists where insulation for direct currents is acceptable (e.g. when the purpose of the multi-potential guard is to minimize capacitive leakage or to deal with self-generating parasitic voltages between a driven guard shield and the conductor it guards).

EXPERIMENTAL VERIFICATION

Two lumped-parameter models were constructed to demonstrate experimentally the effectiveness of the multi-potential guarding technique of this invention. In the charge channel model, several leakage components were included to permit significant variations in the current distribution among the inner guard components. In the gradient guard model, a source of potential difference between a conductor and its guard was varied with leakage impedance included to limit the resulting current.

In each experiment, the circuit model was varied by attaching passive and active test shunts to elements of the network. Both legal and illegal conditions were simulated by the active test shunt. The automatic change of the inner guard node potential to result in essentially no current through impedance Z1 and the constant voltage observed across the load demonstrate the effectiveness of the multi-potential guarding technique in both models for legal conditions.

Figure 4:
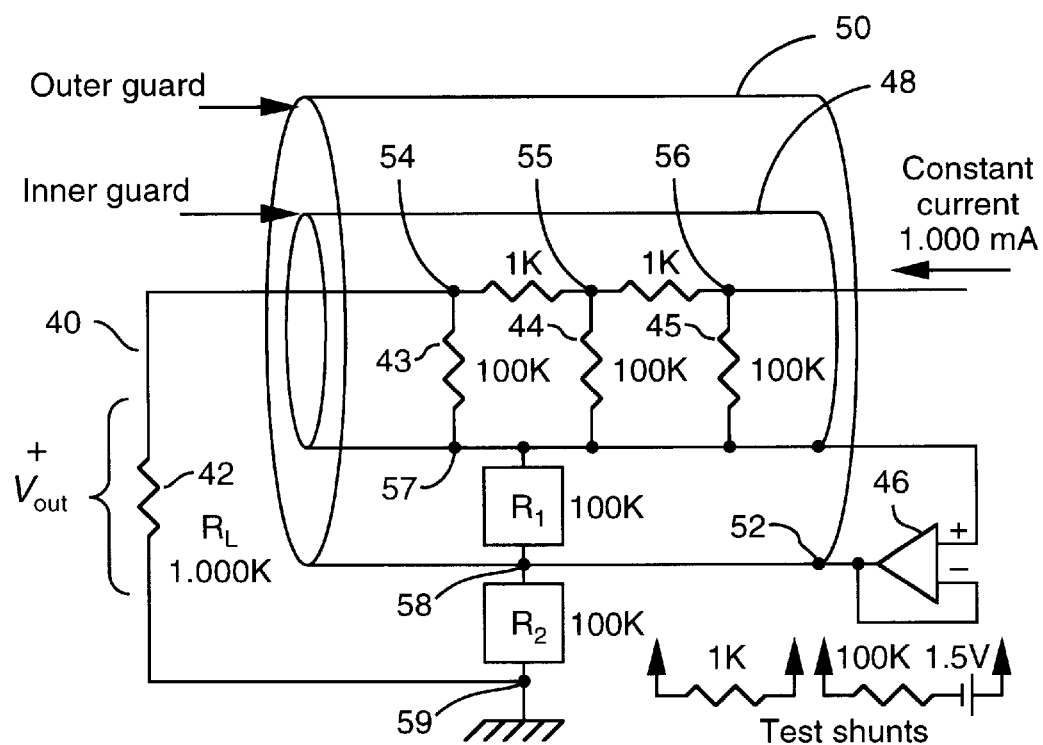
FIG. 4 shows a schematic test circuit to demonstrate the charge channel application of the multi-potential guarding technique of FIG. 3.

The first experiment was designed using lumped-parameter impedances to demonstrate the charge channel application of the multi-potential guarding technique. The test circuit schematic diagram, including component values, is shown in FIG. 4 of the drawings. The results of the first experiment are presented in Table 1. The circuit simulates a high resistance (2 KΩ) conductor 40 having extremely poor insulation (100 KΩ). The conductor and insulation impedances can be drastically lowered by paralleling them with a passive test shunt resistance (1 KΩ). A constant current is applied to develop a voltage gradient as it passes through the conductor 40. Without activating the guard system, only part of the input current flows through the conductor to a load resistor 42. The remainder of the current flows to ground through resistors 43–45 which are chosen to simulate poor insulation. When the guard system is activated, the same current level provided by the source should also flow through the load resistance 42. The guard drive amplifier 46 should operate to make $R_1$, the simulated impedance between the inner and outer guard shields 48 and 50, appear to be an open circuit.

Metal-film components with 1% tolerance and 100 ppm/° C. stability were used to construct and vary the circuit of FIG. 4. Components with greater stability and accuracy were not deemed necessary because of the large changes to be made in the circuit and particularly because the reliability of the technique is indicated by the magnitude of any changes that occur in the voltage drop, $V_{out}$, across load resistor 42.

The excitation current was adjusted with resistors 43–45 disconnected and without leakage to develop a 1.000 V drop across the 1 KΩ load resistor 42 using a digital voltmeter with an input resistance of 10 MΩ. Ideally, when resistors 43–45 are connected, the voltage drop across resistor 42 will remain at 1.000 V when the gradient-guard drive from the output of the operational amplifier 46 is connected to the outer guard node 52 and the various other resistances in the circuit are individually shunted. The outer guard node 52 should experience wide variations in potential as the operational amplifier 46 acts to maintain the charge channel.

When the output of operational amplifier 46 is disconnected from the outer guard node 52, the voltage drop across load resistor 42 is expected to be less than 1 V and to experience significant variations as the several circuit elements are individually shunted with 1 KΩ. An active test shunt was also used with the circuit of FIG. 4, consisting of a 100 KΩ resistor in series with a single AA alkaline cell. Similar results were obtained, except for the case of shunting from junctions 57 to 58. This illegal test violates the condition that the inner guard shield 48 receives no charge from outside the region it serves to guard.

Figure 5:
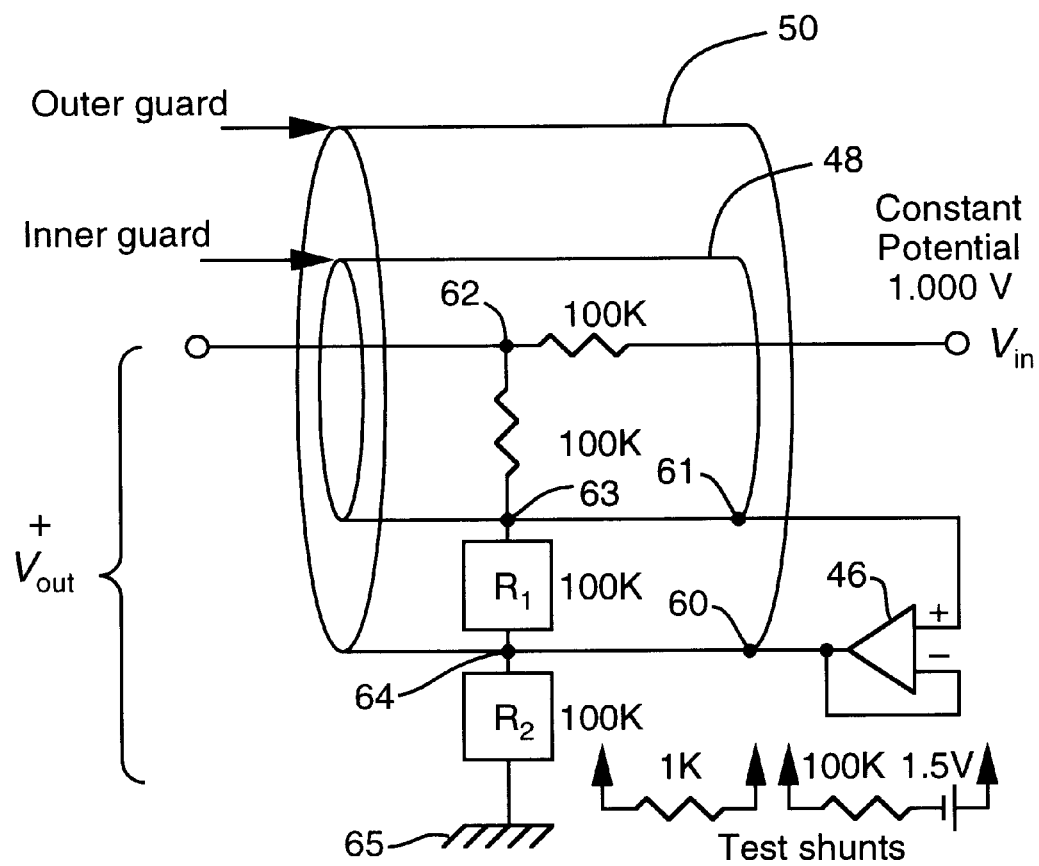
FIG. 5 shows a schematic test circuit to demonstrate an aspect of the multi-potential guarding technique of the present invention.

The second experiment was designed using lumped impedances and a voltage source to demonstrate a rejection by the multi-potential guarding technique of conductor-to-guard impedance and voltage variations. The test circuit schematic diagram, including component values, is shown in FIG. 5 of the drawings. The electronic components, test equipment and procedure used were the same those employed in the first experiment described above when referring to FIG. 4.

The input voltage, $V_{in}$, is adjusted to result in an indication, $V_{out}$, of 1.000 V with the guard system activated. Again, both passive and active shunts were used to provide circuit variations. $V_{out}$ is expected to remain at 1.000 V when the gradient-guard drive from the output of the operational amplifier 46 is connected to the outer guard node 60 and various resistances in the circuit are legally shunted. The outer guard node 60 should experience wide variations in potential as the operational amplifier acts to maintain the charge channel.

Tables 1 and 2 listed below present the data validity checks and the experimental results. The various test conditions during the experiment are listed along with the corresponding output voltage, $V_{out}$, and the voltage at the output of the guard-drive amplifier 46, as applicable.

The results from the first experiment presented in Table 1 demonstrate that the charge-channel guard of FIG. 4 does indeed cause significant variations in potential gradients and leakage impedances to have an insignificant impact on the voltage drop across load resistor 42. The variations in the output voltage were below 100 ppm (the resolution of the voltmeter observing the output) while the guard node 52 assumed potentials ranging from 1.0285 V to 2.9220 V. The constant voltage across load resistor 42 in the first experiment in the presence of quite large variations in conductor and leakage impedance demonstrates that a charge channel was, in effect, created for the excitation current. Connecting the active shunt between junctions 54 and 55 violates the requirement that no charge may be arrive at the inner guard shield 48 from outside the guarded region. As expected, the output voltage varies from ideal in this situation.

The results from the second experiment presented in Table 2 demonstrate that the gradient guard of FIG. 5 does indeed cause significant variations in potential gradients and leakage impedances to have an insignificant impact on the output voltage, $V_{out}$. The constant output voltage, $V_{out}$, in the second experiment in the presence of quite large variations in noise voltage and leakage impedance demonstrates that a gradient guard was, in effect, created to transmit the input voltage. Again, connecting an active shunt between nodes 63 and 64 violates the requirement that no charge may arrive at the inner guard shield 48 from outside the guarded region. As expected, the output voltage varies from ideal in this situation.

The second experiment also demonstrates how a real (non-ideal) operational amplifier 46 can cause difficulties. The amplifier in use had an input offset voltage of about 100 microvolts. This appeared as a constant, non-zero potential difference between the inner and outer guard shields 48 and 50. With average (e.g. 100 KΩ) insulation between the inner and outer guards 48 and 50, the current (100 microvolts divided by 100 KΩ) injected in the inner guard node 61 was insignificant. However, with very poor insulation (1 KΩ), the current becomes significant as indicated by the 11 mV (about one percent) change in $V_{out}$.

The experiments described above were designed to demonstrate the ability of the multi-potential guarding technique and some of its limitations, not to model particular applications. The experiments used values representing unusually large wire and small insulation-impedance magnitudes along with a large noise voltage all undergoing huge variations. Nevertheless, variations in the output voltage were typically unobservable.

In summary, the classical driven guard technique of FIG. 1 applies only to electronic circuit regions that contain a single potential. The multi-potential guarding technique of this invention uses a driven outer guard to effectively guard regions within an inner guard that contain various potential gradients and noise sources. The gradient-guard configuration constrains charges within an inner guard shield and the charge-channel configuration assures that all of the current entering a conductor at one end will exit the conductor at its other end even when the conductor and its guards are embedded in poor insulation resistance to ground. The multi-potential guarding technique disclosed herein can also significantly reduce the externally-observable effects of noise potentials within the guarded region which may arise from tribo-electric effects, radiation exposure, electromechanical inputs and other noise sources.

TABLE 1

Charge channel test results

| Test Condition | No Guard $V_{out}$ (Volts) | Passive Shunt = 1 KΩ | | Active Shunt = 1.53V + 100 KΩ | |
|---|---|---|---|---|---|
| | | Guard Node (Volts) | $V_{out}$ (Volts) | Guard Node (Volts) | $V_{out}$ (Volts) |
| Excitation-off zero (noise check) | 0.0000 | 0.0000 | 0.0000 | — | — |
| Excitation on on, no leakage network: | | | | | |
| Constant I directly to RL (1 KΩ load) | 1.0000 | — | — | — | — |
| Constant I source check (additional 2 KΩ load) | 1.0000 | — | — | — | — |
| Excitation and guard drive on, | | | | | |
| indicated network nodes shunted | | | | | |
| No Shunt | 0.9915 | 1.9915 | 1.0000 | 1.9915 | 1.0000 |
| 54 to 55 | 0.9943 | 1.6627 | 1.0000 | 1.9916 | 1.0000 |
| 55 to 56 | 0.9922 | 1.9915 | 1.0000 | 1.9575 | 1.0000 |
| 54 to 57 | 0.9949 | 1.0285 | 1.0000 | 1.3533 | 1.0000 |
| 55 to 57 | 0.9902 | 1.9907 | 1.0000 | 1.6104 | 1.0000 |
| 56 to 57 | 0.9856 | 2.9220 | 1.0000 | 1.8577 | 1.0000 |
| 57 to 58 | 0.9853 | 1.9881 | 1.0000 | 2.5255 | 0.9617 |
| 58 to 59 | 0.9813 | 1.9915 | 1.0000 | 1.9915 | 1.0000 |

TABLE 2

Gradient guard test results

| Test Condition | No Guard $V_{out}$ (Volts) | Passive Shunt = 1 KΩ | | Active Shunt = 1.53V + 100 KΩ | |
|---|---|---|---|---|---|
| | | Guard Node (Volts) | $V_{out}$ (Volts) | Guard Node (Volts) | $V_{out}$ (Volts) |
| Excitation-off zero (guard amplifier removed) | 0.0000 | 0.0000 | 0.0000 | — | — |
| Excitation on, no noise or leakage network: | 1.0000 | | | | |
| Voltage source directly to meter | 1.0055 | — | — | — | — |
| Voltage source through 100 KΩ to meter | 0.9955 | — | — | — | — |
| Excitation and guard drive on, | | | | | |
| indicated network nodes shunted | | | | | |
| No shunt | 0.7483 | 1.0143 | 1.0000 | — | — |
| 62 to 63 | 0.6669 | 1.0099 | 1.0000 | 1.7782 | 1.0000 |
| 63 to 64 | 0.6668 | 0.9944 | 0.9890 | 4.0770 | 2.5170 |
| 64 to 65 | 0.6668 | 1.0142 | 1.0000 | 1.0144 | 1.0000 |

What is claimed is:

1. A method for guarding an electrical system containing potential gradients and sources of electrical noise so as to prevent undesired electrical charge exchange to or from the system, said method comprising the steps of:

surrounding the system by an inner electrically conductive guard having an electrical potential;

surrounding said inner electrically conductive guard by an outer electrically conductive guard; and driving said outer electrically conductive guard to an electrical potential that is substantially identical to the electrical potential of said inner electrically conductive guard so that there is substantially no potential difference between said inner and outer electrically conductive guards, whereby to effectively produce a high insulation impedance around the system.

2. The method for guarding recited in claim 1, wherein the electrical potential of said inner electrically conductive guard relative to the electrical potential to which said outer electrically guard is driven causes essentially no net current flow to said inner electrically conductive guard from the electrical system located therewithin.

3. The method for guarding recited in claim 1, including the additional step of driving said outer electrically conductive guard by means of an operational amplifier having a high input impedance and a low output impedance.

4. The method for guarding recited in claim 3, wherein said operational amplifier has output means and inverting and non-inverting input means, said inner electrically conductive guard being connected to the non-inverting input means of said operational amplifier, while the output means and the inverting input means of said operational amplifier are connected to said outer electrically conductive guard.

5. The method for guarding recited in claim 1, wherein a first electrical impedance exists between said inner and outer electrically conductive guards, and a second electrical impedance exists between said outer electrically conductive guard and electrical ground.

6. The method for guarding recited in claim 1, including the additional step of arranging the inner electrically conductive guard to lie inside and spaced from the outer electrically conductive guard so that a region of high impedance is established in the space between said inner and outer electrically conductive guards.

7. The method for guarding recited in claim 1, wherein the electrical system surrounded by said inner electrically conductive guard includes a current carrying wire that is connected to an electrical load impedance that senses a physical condition such that the currents entering and leaving said conductor are identical.

8. The method for guarding recited in claim 7, wherein said electrical load impedance is adapted to measure temperatures.

9. A method for guarding an electrical conductor that carries information and travels through a region containing potential gradients and sources of electrical noise such that substantially all of the information carried by the electrical conductor into the region is also carried by the electrical conductor out of the region, said method comprising the steps of:

surrounding the electrical conductor by an inner electrically conductive guard having an electrical potential;

surrounding said inner electrically conductive guard by an outer electrically conductive guard; and driving said outer electrically conductive guard to an electrical potential that is substantially identical to the electrical potential of said inner electrically conductive guard so that there is substantially no potential difference between said inner and outer electrically conductive guards to effectively produce a high insulation impedance around the electrical conductor, whereby parasitic electrical potentials that occur within the inner electrically conductive guard are unable to cause an electrical charge to flow outside said inner electrically conductive guard to alter the information carried by said electrical conductor.

10. The method for guarding recited in claim 9, including the additional steps of driving said outer electrically conductive guard by means of an operational amplifier having a high input impedance, a low output impedance, output means, and inverting and non-inverting input means;

connecting said inner electrically conductive guard to the non-inverting input means of said operational amplifier; and connecting said outer electrically conductive guard to the inverting input means and the output means of said operational amplifier.

11. The method for guarding recited in claim 9, wherein the information carried by the electrical conductor through the region containing potential gradients and sources of electrical noise is a current having a magnitude, one end of said electrical conductor connected to an electrical load impedance that senses a physical condition, and the opposite end of said electrical conductor connected to a source of constant current, the effective high insulation impedance around the electrical conductor causing the magnitude of the current being carried through said region by said conductor to remain substantially constant.

12. The method for guarding recited in claim 11, where in said electrical load impedance is adapted to measure temperatures.

* * * * *